(12) United States Patent
Fu et al.

(10) Patent No.: US 12,020,998 B2
(45) Date of Patent: Jun. 25, 2024

(54) SEMICONDUCTOR STRUCTURE AND PACKAGE STRUCTURE HAVING MULTI-DIES THEREOF

(71) Applicant: MEDIATEK INC., Hsinchu (TW)

(72) Inventors: Chuan-Shian Fu, Hsinchu (TW); Cheng-Jyi Chang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 255 days.

(21) Appl. No.: 17/218,328

(22) Filed: Mar. 31, 2021

(65) Prior Publication Data

US 2021/0320040 A1 Oct. 14, 2021

Related U.S. Application Data

(60) Provisional application No. 63/007,980, filed on Apr. 10, 2020.

(51) Int. Cl.
| | |
|---|---|
| *H01L 23/02* | (2006.01) |
| *H01L 23/498* | (2006.01) |
| *H01L 23/538* | (2006.01) |
| *H01L 23/544* | (2006.01) |
| *H01L 25/065* | (2023.01) |
| *H01L 25/18* | (2023.01) |

(52) U.S. Cl.
CPC .......... *H01L 23/02* (2013.01); *H01L 23/5386* (2013.01); *H01L 23/544* (2013.01)

(58) Field of Classification Search
CPC ... H01L 23/02; H01L 23/5386; H01L 23/544; H01L 23/3128; H01L 23/49816; H01L 23/49822; H01L 23/522; H01L 23/56; H01L 23/585; H01L 24/02; H01L 24/13; H01L 24/24; H01L 24/25; H01L 25/0655; H01L 25/18
See application file for complete search history.

(56) References Cited

U.S. PATENT DOCUMENTS

| | | | |
|---|---|---|---|
| 2014/0120696 A1 | 5/2014 | Aleksov et al. | |
| 2017/0194278 A1* | 7/2017 | Shao | ........................ H01L 24/81 |
| 2018/0122754 A1 | 5/2018 | Tatour | |
| 2018/0294230 A1* | 10/2018 | Dabral | .................. H01L 23/522 |
| 2019/0027466 A1* | 1/2019 | Fricker | .................. H01L 24/82 |
| 2020/0051890 A1 | 2/2020 | Fricker | |

(Continued)

FOREIGN PATENT DOCUMENTS

| | | |
|---|---|---|
| CN | 109599358 A | 4/2019 |
| JP | 2005-167198 A | 6/2005 |

OTHER PUBLICATIONS

German language office action dated Dec. 6, 2022, issued in application No. DE 10 2021 108 736.8.

(Continued)

*Primary Examiner* — Omar F Mojaddedi
(74) *Attorney, Agent, or Firm* — McClure, Qualey & Rodack, LLP

(57) ABSTRACT

A semiconductor structure includes a base layer, semiconductor dies on the base layer, and an inter-die connection layer electrically connecting two adjacent semiconductor dies. Each of the semiconductor dies includes an active area and a seal ring area including a seal ring surrounding the active area. The inter-die connection layer extends over adjacent portions of the seal rings in the seal ring areas of the two adjacent semiconductor dies.

32 Claims, 10 Drawing Sheets

(56) References Cited

U.S. PATENT DOCUMENTS

2020/0066657 A1* 2/2020 Huang .................... H01L 23/10
2020/0075497 A1   3/2020 Dabral et al.
2020/0135664 A1* 4/2020 Tseng .................... H01L 23/585
2020/0350221 A1* 11/2020 Liu ........................ H01L 22/32

OTHER PUBLICATIONS

Chinese language office action dated Aug. 11, 2021, issued in application No. TW 110112548.
Chinese language office action dated Apr. 11, 2024, issued in application No. CN 202110365455.3.

* cited by examiner

SEMICONDUCTOR STRUCTURE AND PACKAGE STRUCTURE HAVING MULTI-DIES THEREOF

CROSS REFERENCE TO RELATED APPLICATIONS

This application is based on, and claims priority of U.S. Provisional Application No. 63/007,980 filed on Apr. 10, 2020, the entirety of which is incorporated by reference herein.

BACKGROUND OF THE INVENTION

Field of the Invention

The present invention relates to a semiconductor structure and parts of the semiconductor structure in a package structure, and in particular to a semiconductor structure and a package structure having multi-dies implementation obtained from the semiconductor structure.

Description of the Related Art

A semiconductor package can not only provide a semiconductor die with protection from environmental contaminants, but it can also provide an electrical connection between the semiconductor die packaged therein and another device, such as a printed circuit board (PCB). For example, one or more semiconductor dies may be enclosed in an encapsulating material, and are electrically connected to the substrate of a semiconductor package. Then, the semiconductor package can be electrically connected to a printed circuit board using a bonding process. For example, the semiconductor package may have bump structures on the bottom surface of the substrate, and the bump structures are mounted on and electrically coupled to the printed circuit board. Different packaging types of the semiconductor packages have been developed to improve the electrical performance of the dies in the packages.

Although existing package structures have been adequate for their intended purposes, they have not been entirely satisfactory in all respects. For example, signal loss and/or power loss occurs between the dies of a package structure. Thus, there are still problems to be overcome in regards to semiconductor structures and package structures that have dies obtained from the semiconductor structure.

BRIEF SUMMARY OF THE INVENTION

Some embodiments of the present disclosure provide semiconductor structures. An exemplary embodiment of a semiconductor structure includes a base layer, semiconductor dies on the base layer, and an inter-die connection layer electrically connecting two adjacent semiconductor dies. Each of the semiconductor dies includes an active area and a seal ring area including a seal ring surrounding the active area. The inter-die connection layer extends over adjacent portions of the seal rings in the seal ring areas of the two adjacent semiconductor dies.

In some embodiments, the adjacent portions of the seal rings of the two adjacent semiconductor dies have recesses, and the inter-die connection layer passes through the recesses. In some embodiments, the inter-die connection layer is level with one conductive layer of the seal rings. In some embodiments, the seal ring of each of the semiconductor dies includes a first interconnection stack over the base layer and surrounding the active area, wherein the first interconnection stack comprises first conductive lines; and a second interconnection stack on the first interconnection stack and surrounding the active area, wherein the second interconnection stack comprises second conductive lines. In some embodiments, the second interconnection stack has a first recess, and the inter-die connection layer passes through the first recess. In some embodiments, the inter-die connection layer is level with one of the second conductive lines. The second conductive lines and the inter-die connection layer may be made of the same material. In some embodiments, the thickness of the inter-die connection layer is greater than the thickness of the first conductive line. In some embodiments, the seal ring of each of the semiconductor dies further includes a third interconnection stack on the second interconnection stack and surrounding the active area, wherein the third interconnection stack comprises third conductive lines. The second interconnection stack has a first recess, the third interconnection stack has a second recess, and the second recess is in communication with the first recess. In some embodiments, the inter-die connection layer passes through either the first recess or the second recess. In some embodiments, the inter-die connection layer passes through the first recess, and the semiconductor structure further includes another inter-die connection layer passing through the second recess. In some embodiments, the semiconductor structure further includes several seal frames on the base layer, wherein each of the seal frames surrounds parts of the semiconductor dies and defines a die region. In some embodiments, the semiconductor structure further includes a first seal frame on the base layer and surrounding a first group of semiconductor dies, wherein the first seal frame defines a first die region; and a second seal frame on the base layer and surrounding a second group of semiconductor dies, wherein the second seal frame defines a second die region, wherein the second die region is adjacent to the first die region, and a scribe line is positioned between the first die region and the second die region. In some embodiments, no inter-die connection layer extends over the first die region and the second die region. In some embodiments, the semiconductor dies on the base layer are separated from each other by a spacing pattern, The spacing pattern includes a plurality of first spaces extending in a first direction (e.g. the X-direction) and a plurality of second spaces extending in a second direction, (e.g. the Y-direction), wherein the first direction is different from the second direction. In some embodiments, the seal ring includes several interconnection stacks over the base layer, and the inter-die connection layer is formed above the interconnection stacks. In some embodiments, the inter-die connection layer is electrically insulated from the seal ring. In some embodiments, the base layer includes active devices electrically connected to the respective semiconductor dies.

Some embodiments of the present disclosure provide a package structure. An exemplary embodiment of a package structure includes a substrate having a first surface and a second surface opposite to the first surface, wherein the substrate includes a redistribution layer (RDL). The package structure also includes a multi-dies component disposed over the first surface of the substrate, and the multi-dies component is electrically coupled to the redistribution layer of the substrate. The multi-dies component includes a base layer, semiconductor dies on the base layer and an inter-die connection layer electrically connecting two adjacent semiconductor dies. The semiconductor dies of the multi-dies component are spaced apart from each other. The inter-die connection layer extends over the seal rings in seal ring areas of two adjacent semiconductor dies. In some embodiments, the base layer has a top surface and a bottom surface opposite to the top surface, and the semiconductor dies are disposed on the top surface of the base layer, wherein the top surface of the base layer faces the first surface of the substrate. In some embodiments, the inter-die connection layer is positioned between the top surface of the base layer and the first surface of the substrate. In some embodiments, the inter-die connection layer passes through a space between two adjacent semiconductor dies of the multi-dies component. In some embodiments, the package structure further includes a molding material surrounding the semiconductor dies, wherein the semiconductor dies are separated by the molding material, and the inter-die connection layer between two adjacent semiconductor dies passes through the molding material. In some embodiments, In some embodiments, A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
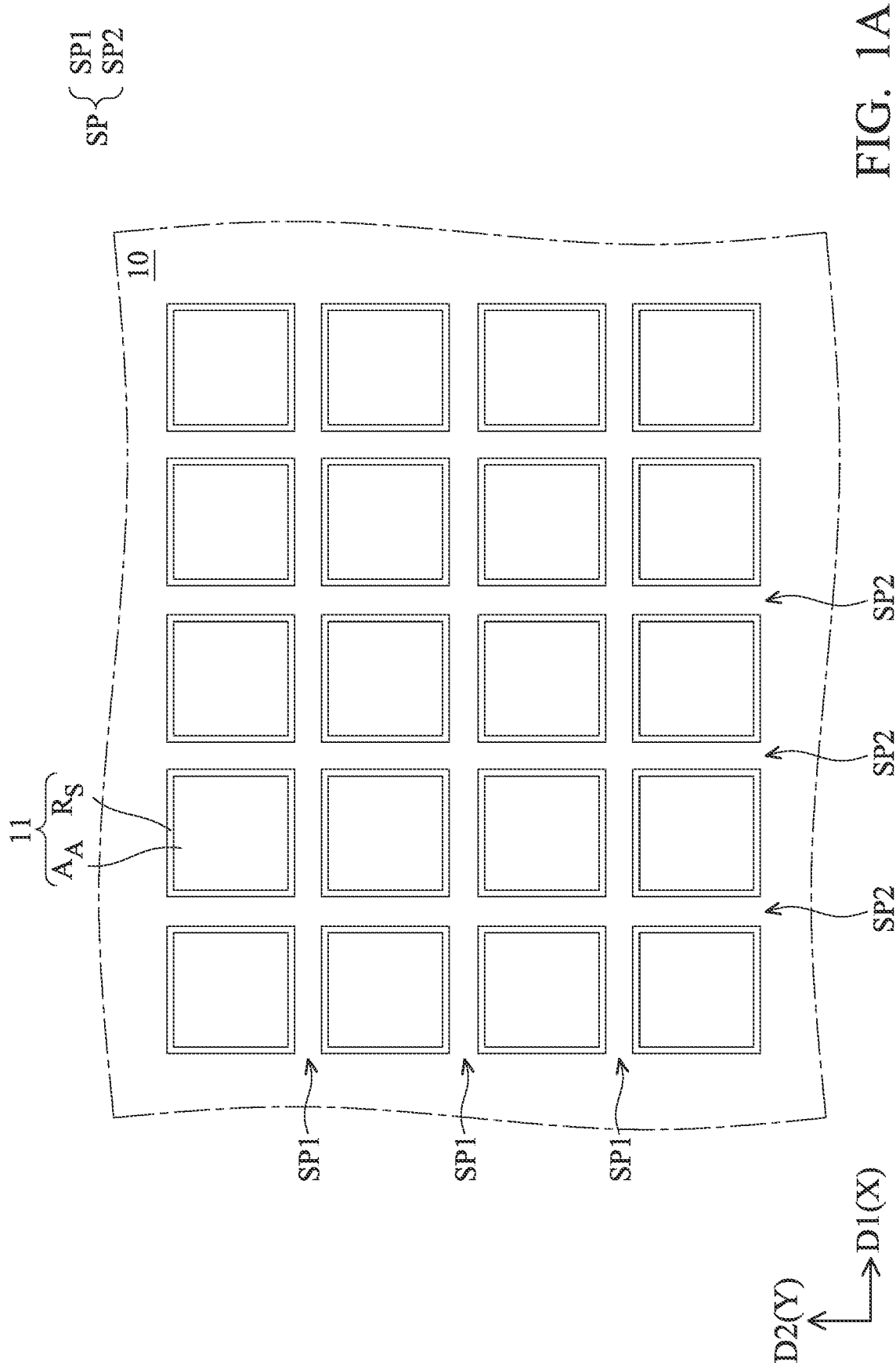
FIG. 1A and FIG. 1B are top views of intermediate stages of a method for forming a semiconductor structure, in accordance with some embodiments of the present disclosure.

The following description is of the best-contemplated mode of carrying out the invention. This description is made for the purpose of illustrating the general principles of the invention and should not be taken in a limiting sense. The scope of the invention is determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It should be understood that when an element is referred to as being "connected" or "contacting" to another element, it may be directly connected to or contacting the other element, or intervening elements may be present.

Similarly, it should be understood that when an element such as a layer, region or substrate is referred to as being "on" another element, it can be directly on the other element or intervening elements may be present. In contrast, the term "directly" means that there are no intervening elements. It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. It should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same or similar reference numerals or reference designators denote the same or similar elements throughout the specification.

Some embodiments of the disclosure are described. It should be noted that additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
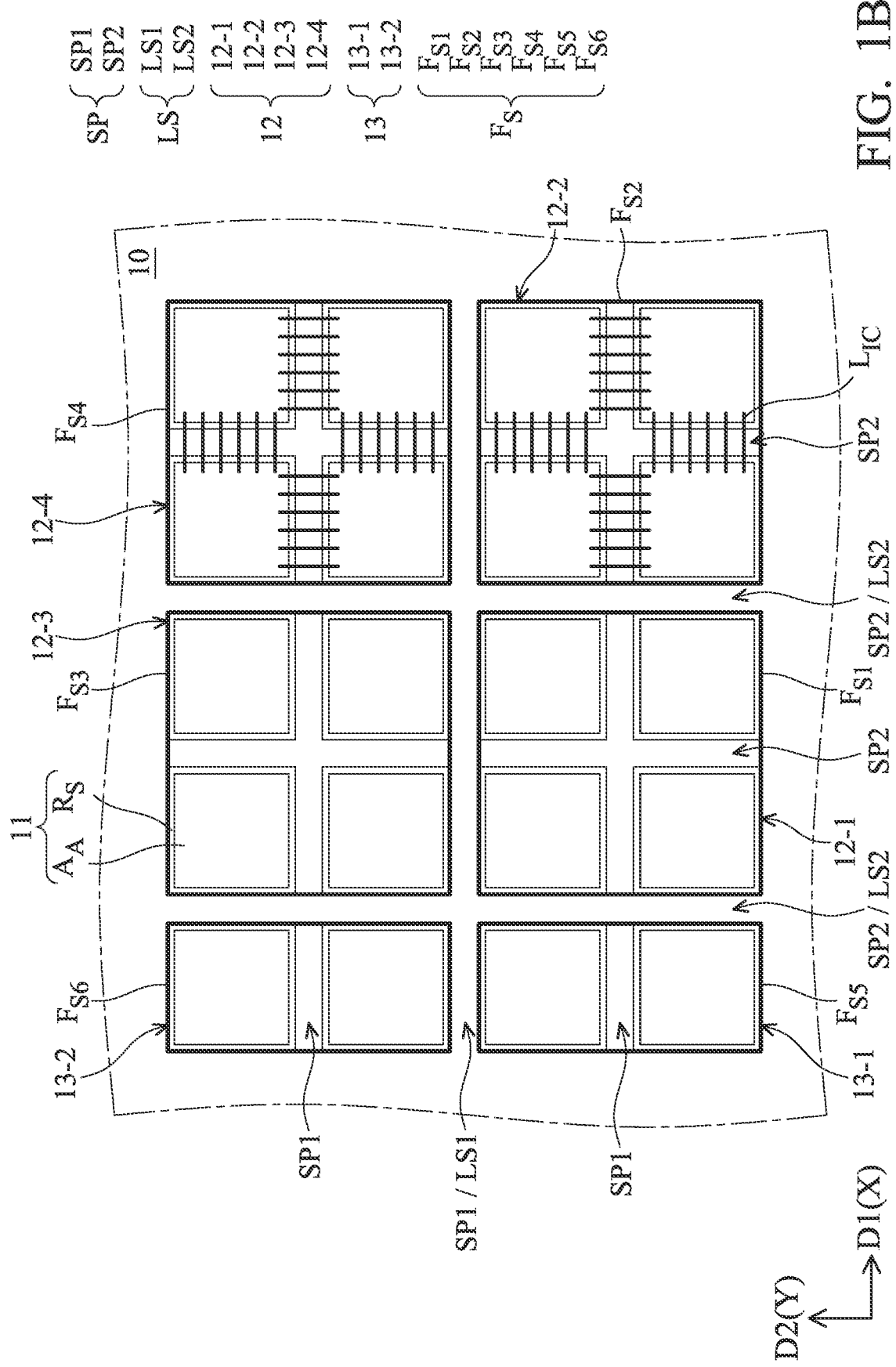

FIG. 1A and FIG. 1B are top views of intermediate stages of a method for forming a semiconductor structure, in accordance with some embodiments of the present disclosure. The semiconductor structure can be a wafer including several semiconductor dies on a base layer 10. FIG. 1A and FIG. 1B depict parts of the semiconductor dies 11 on the base layer 10 for illustration some embodiments. In some embodiments, each of the semiconductor dies 11 includes an active area $A_A$ and a seal ring $R_S$ surrounding the active area $A_A$. The active area $A_A$ includes active elements, such as integrated circuits and one or more transistor. The seal ring $R_S$ protects the active elements in the active area $A_A$ against harmful contaminants such as moisture, humidity, particulates and/or ionic impurities.

The semiconductor dies 11 on the base layer 10 can be arranged as a matrix pattern, as shown in FIG. 1A and FIG. 1B. In some embodiments, the semiconductor dies on the base layer are separated from each other by a spacing pattern SP. The spacing pattern SP includes several first spaces SP1 extending in the first direction D1 (such as the X-direction) and the second spaces SP2 extending in the second direction D2 (such as the Y-direction). The second direction D2 is different from the first direction D1. For example, the second direction D2 (such as the Y-direction) is perpendicular to the first direction D1 (such as the X-direction). The first spaces SP1 are spaced apart from each other in the second direction D2, and the second spaces SP2 are spaced apart from each other in the first direction D1.

According to the embodiments of the disclosure, several die components are formed after the wafer sawing process. Most of the die components each include two or more than two of the semiconductor dies 11, so that those die components can be referred as multi-dies components. Each of the multi-dies components may include a seal frame $F_S$ at the outsides of the semiconductor dies 11, wherein the seal frame $F_S$ surrounds the semiconductor dies 11 to define a die region. In some embodiments, the seal frame $F_S$ also provides an effective environmental barrier that protects the semiconductor dies 11 from moisture, humidity, particulates, or ionic impurities. As shown in FIG. 1B, four die regions 12 each including four semiconductor dies 11 and two die regions 13 each including two semiconductor dies 11 are depicted for exemplification. Also, the semiconductor dies 11 of a die region 12/13 are electrically connected to each other by one or more inter-die connection layers $L_{IC}$.

In this example, as shown in FIG. 1B, the first seal frame $F_{S1}$ on the base layer 10 surrounds a first group of (e.g. four) semiconductor dies 11 to define the first die region 12-1, and the second seal frame $F_{S2}$ on the base layer 10 surrounds a second group of (e.g. four) semiconductor dies 11 to define the second die region 12-2. The third seal frame $F_{S3}$ on the base layer 10 surrounds a third group of (e.g. four) semiconductor dies 11 to define the third die region 12-3, and the fourth seal frame $F_{S4}$ on the base layer 10 surrounds a fourth group of (e.g. four) semiconductor dies to define the fourth die region 12-4. Also, the fifth seal frame $F_{S5}$ on the base layer 10 surrounds a fifth group of (e.g. two) semiconductor dies 11 to define the fifth die region 13-1, and the sixth seal frame $F_{S6}$ on the base layer 10 surrounds a sixth group of (e.g. two) semiconductor dies 11 to define the sixth die region 13-2. The first die region 12-1, the second die region 12-2, the third die region 12-3 and the fourth die region 12-4 can be referred to as the die regions 12 for abbreviation, and the fifth die region 13-1 and the sixth die region 13-2 can be referred to as the die regions 13 for abbreviation. Similarly, the first seal frame $F_{S1}$, the second seal frame $F_{S2}$, the third seal frame $F_{S3}$, the fourth seal frame $F_{S4}$, the fifth seal frame $F_{S5}$ and the sixth seal frame $F_{S6}$ can be referred to as the seal frame $F_S$ for abbreviation.

During the wafer sawing process, the scribe lines LS pass through the spaces between the die regions 12/13 (defined by the seal frames $F_S$). In some embodiments, as shown in FIG. 1B, the scribe lines LS between the die regions 12/13 include the first scribe lines LS1 extending in the first direction D1 (such as the X-direction) and the second scribe lines LS2 extending in the second direction D2 (such as the Y-direction). As shown in FIG. 1B, the first scribe line LS1 passes through one of the first spaces SP1, and the second scribe line LS2 passes through one of the second spaces SP2. Specifically, each of the first scribe lines LS1 overlaps parts of one first space SP1, and each of the second scribe lines LS2 overlaps parts of one second space SP2, in accordance with some embodiments.

In addition, as shown in FIG. 1B, the first scribe line LS1 is positioned (e.g. passes through a space) between the fifth die region 13-1 and the sixth die region 13-2, and positioned between the first die region 12-1 and the third die region 12-3, and also positioned between the second die region 12-2 and the fourth die region 12-4. The second scribe line LS2 is positioned (e.g. passes through a space) between the first die region 12-1 and the second die region 12-2, and also between the third die region 12-3 and the fourth die region 12-4. Another second scribe line LS2 is positioned between the first die region 12-1 and the fifth die region 13-1, and also between the third die region 12-3 and the sixth die region 13-2. It should be noted that no inter-die connection layer extends over the adjacent die regions to connect the semiconductor dies of the adjacent die regions. For example, no inter-die connection layer extends over the first die region 12-1 and the second die region 12-2 to connect the semiconductor dies of the first die region 12-1 and the second die region 12-2. Thus, no inter-die connection layer is cut during the wafer sawing process, in accordance with the embodiments of the present disclosure.

Figure 2:
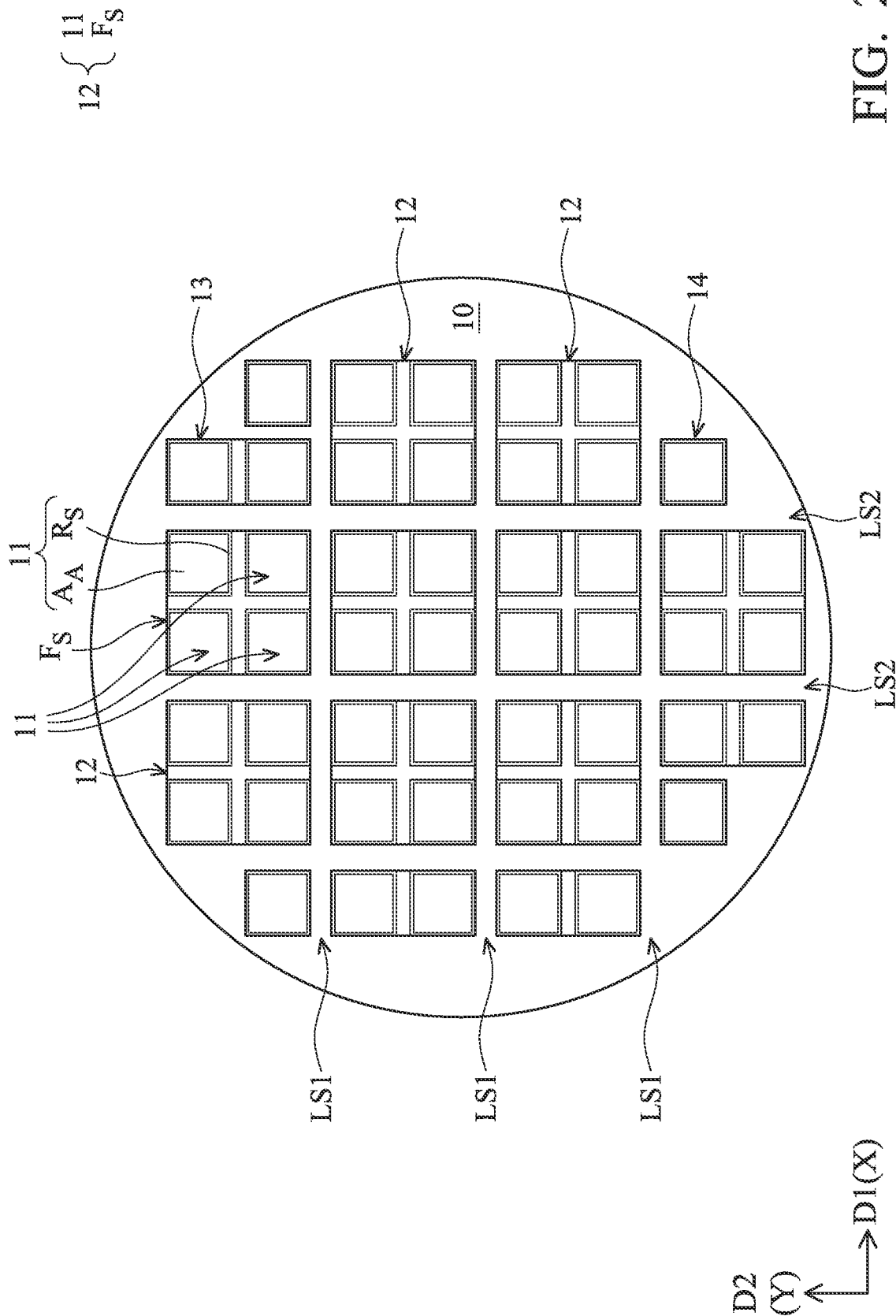
FIG. 2 is a top view of a semiconductor structure, in accordance with some embodiments of the present disclosure.

FIG. 2 is a top view of a semiconductor structure, in accordance with some embodiments of the present disclosure. In some embodiments, a wafer including several semiconductor dies 11 on the base layer 10, and several seal frames $F_S$ are formed on the base layer 10 to define the die regions (such as the die regions 12, 13 and 14). In FIG. 2, most of the die regions each include two or more than two of the semiconductor dies 11. For examples, the wafer in FIG. 2 includes nine die regions 12, four die regions 13 and four die regions 14. Each of the die regions 12 includes four semiconductor dies 11, each of the die regions 13 includes two semiconductor dies 11, and each of the die regions 14 includes one semiconductor die 11. It should be noted that the arrangement of the die regions and the number of semiconductor dies in each of the die regions illustrated in FIG. 2 are provided for exemplification, and the present disclosure is not limited thereto.

Also, as shown in FIG. 2, in some embodiments, the first scribe lines LS1 (such as the X-direction) extending in the first direction D1 and the second scribe lines LS2 extending in the second direction D2 (such as the Y-direction) pass through the spaces between two adjacent die regions 12, 13 and 14. The die regions 12 and 13 can be referred as multi-dies component regions if the semiconductor dies 11 in each of the die regions 12 and 13 fabricated on the base layer 10 have the same function. However, the semiconductor dies 11 on the base layer 10 may have the same function or different functions.

In addition, although FIG. 2 depicts the semiconductor dies 11 in one of the die regions 12 or 13 as being spaced apart from each other, two adjacent semiconductor dies 11 in one of the die regions 12 or 13 are electrically connected to each other by, for example, one or more of the inter-die connection layers $L_{IC}$ in FIG. 1B. After a wafer sawing process is performed, a package structure can be formed by disposing a multi-dies component including two or more (e.g. four) semiconductor dies 11 electrically connected to each other, in accordance with some embodiments of the present disclosure. The semiconductor dies 11 of the multi-dies component provide fast and reliable signal transmission through the inter-die connection layers between the semiconductor dies 11, because the electrical communication between adjacent semiconductor dies 11 (by, for example, the inter-die connection layers $L_{IC}$ in FIG. 1B) can be achieved via the shortest path. Therefore, since signal loss (and/or power loss) between the semiconductor dies 11 (which are electrically connected to each other via the inter-die connection layers $L_{IC}$) of the embodiments can be significantly reduced, a package structure like that in the embodiments that includes a multi-dies component with several semiconductor dies 11 exhibits better electrical performance than package structures with several dies individually from a conventional wafer.

The details of the inter-die connection layers used for connecting adjacent semiconductor dies in a single die region are provided below for exemplification.

Figure 3:
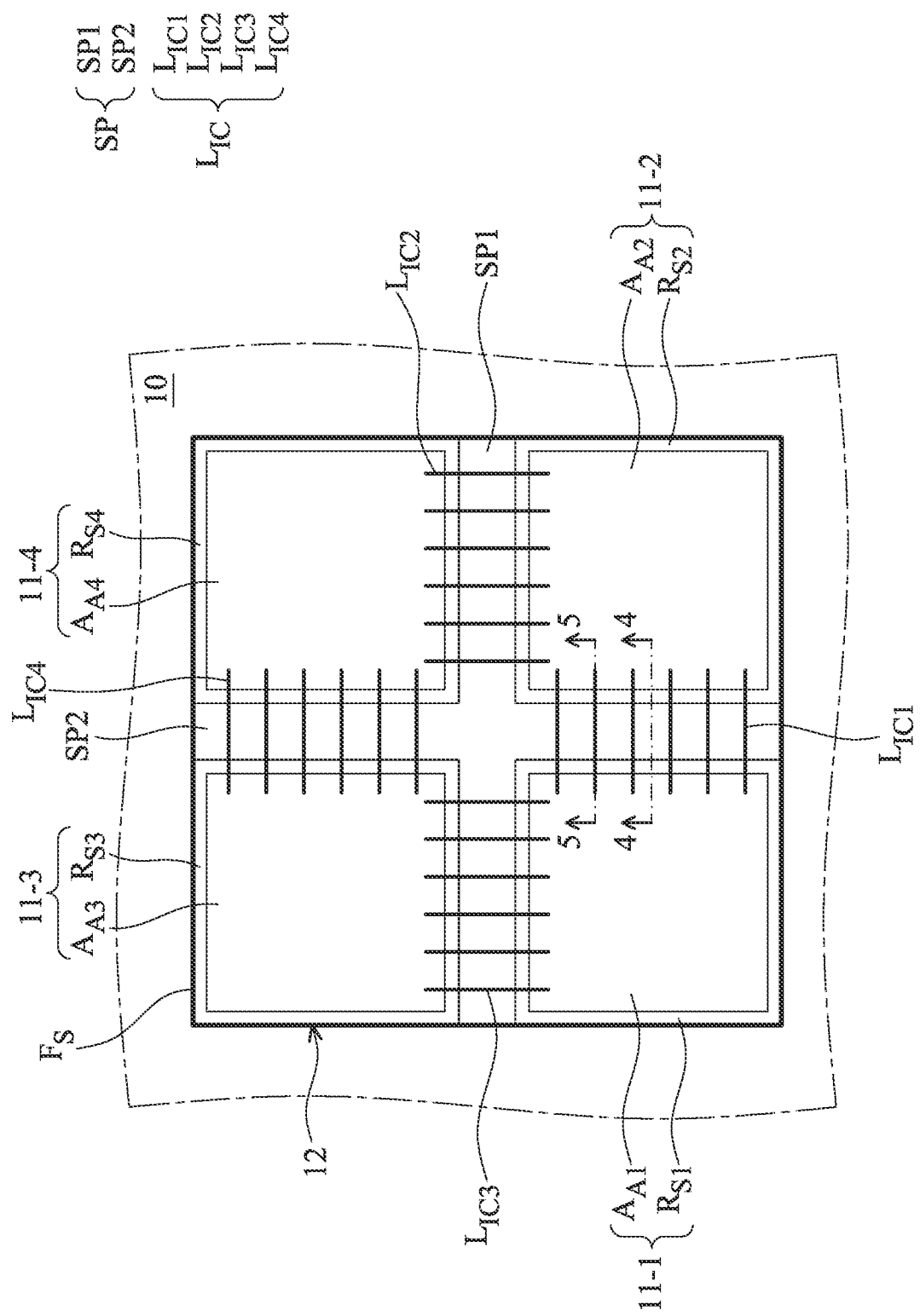
FIG. 3 is a top view of a die region of a semiconductor structure, in accordance with some embodiments of the present disclosure.
Figure 4:
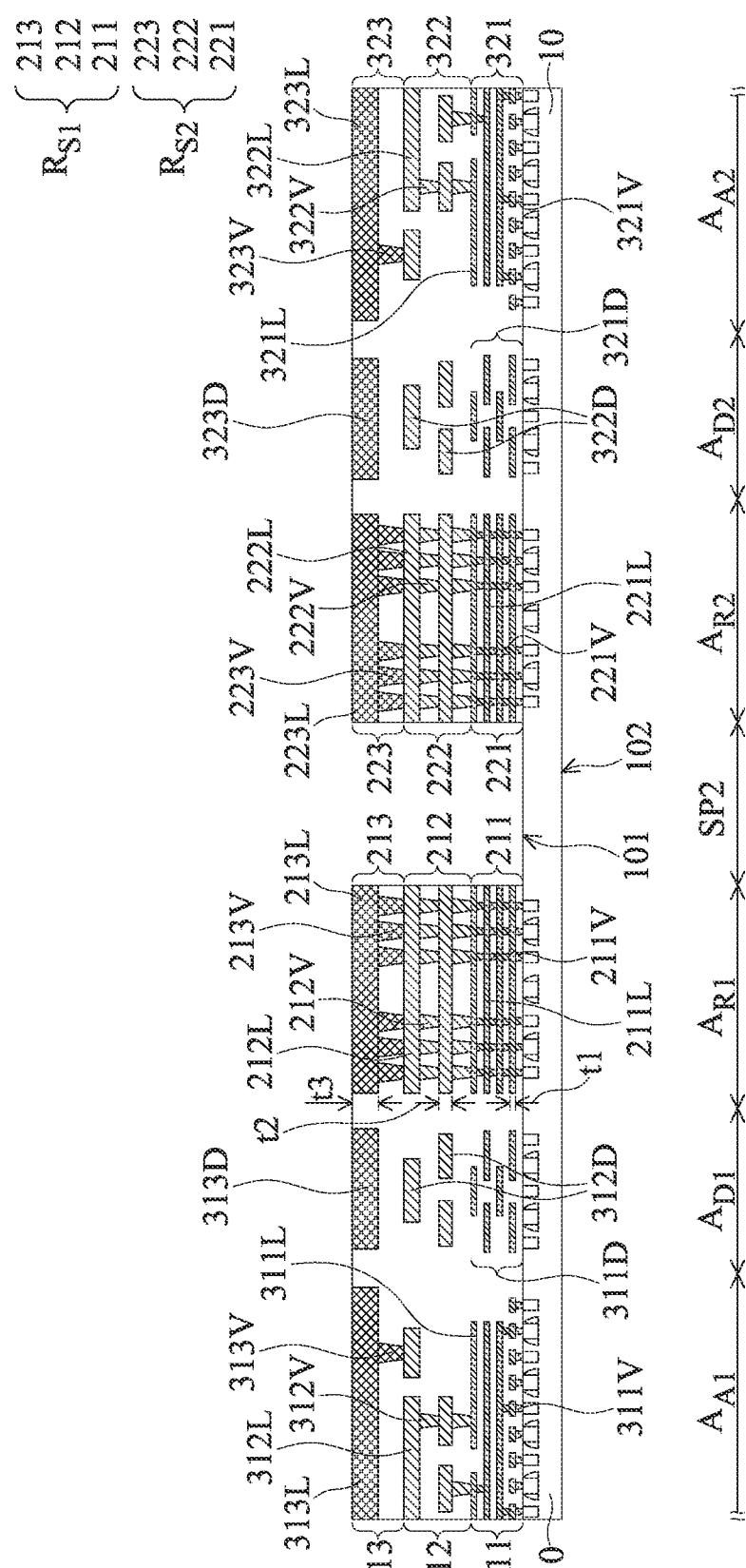
FIG. 4 is a cross-sectional view taken along sectional line 4-4 of the semiconductor structure in FIG. 3.
Figure 5:
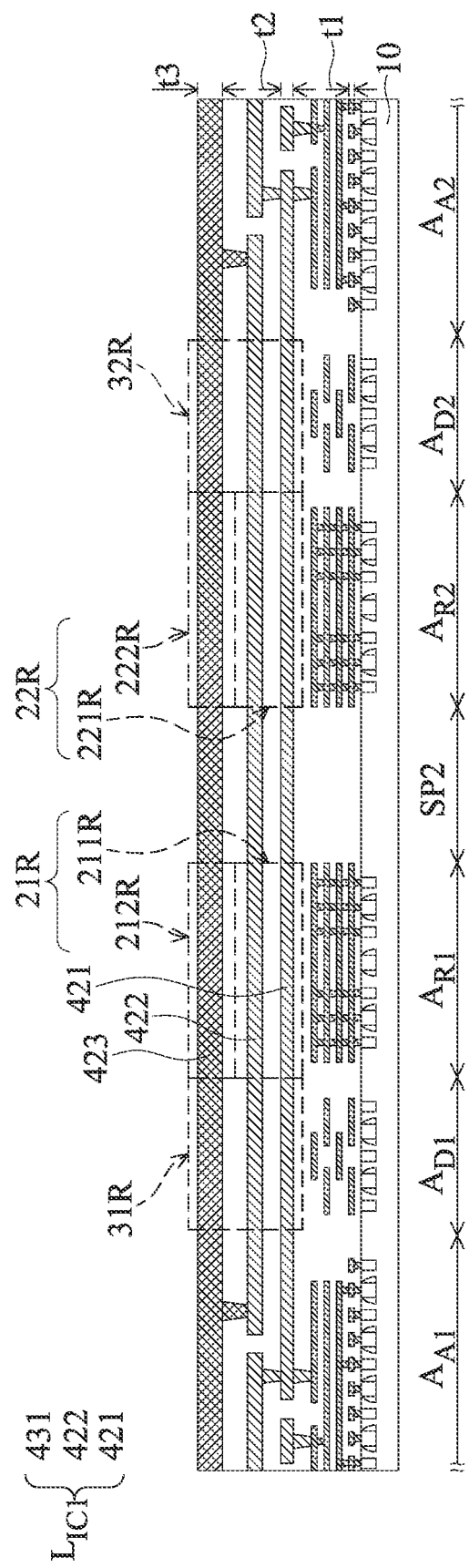
FIG. 5 is a cross-sectional view taken along sectional line 5-5 of the semiconductor structure in FIG. 3.
Figure 6:
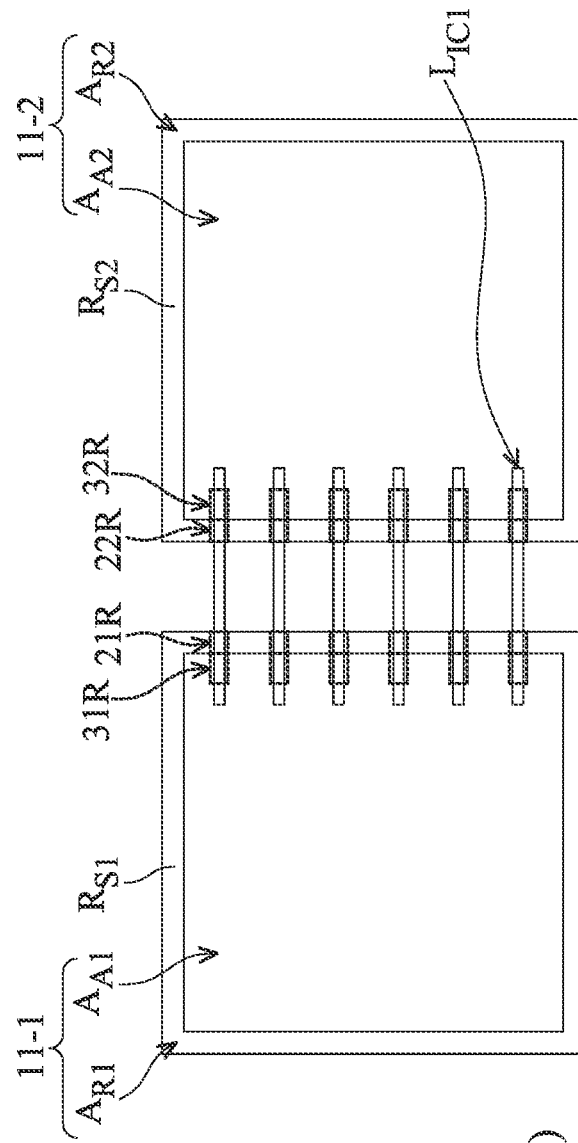
FIG. 6 is a top view of two adjacent semiconductor dies within the die region in FIG. 3, in accordance with some embodiments of the present disclosure.

FIG. 3 is a top view of a die region of a semiconductor structure, in accordance with some embodiments of the present disclosure. FIG. 4 is a cross-sectional view taken along sectional line 4-4 of the semiconductor structure in FIG. 3. FIG. 5 is a cross-sectional view taken along sectional line 5-5 of the semiconductor structure in FIG. 3. FIG. 6 is a top view of two adjacent semiconductor dies within the die region in FIG. 3, in accordance with some embodiments of the present disclosure.

The features/components in FIG. 3, FIG. 4, FIG. 5 and FIG. 6 similar or identical to the features/components in FIG. 1A, FIG. 1B and FIG. 2 are designated with similar or the same reference numbers, and the description of those similar or the identical features/components are not repeated herein. Also, it should be noted that the structures in FIG. 3, FIG. 4, FIG. 5 and FIG. 6 are provided for illustrating one applicable design of the electrical connection between adjacent semiconductor dies in one die region, in accordance with some embodiments of the present disclosure. The present disclosure is not limited thereto.

As shown in FIG. 3, in some embodiments, the die region 12 includes four semiconductor dies 11-1, 11-2, 11-3 and 11-4 over the base layer 10. The base layer 10 has a top surface 101 and a bottom surface 102 opposite to the top surface 101, wherein the semiconductor dies (e.g. the semiconductor dies 11-1 and 11-2) are disposed on the top surface 101 of the base layer 10. The semiconductor die 11-1 includes an active area $A_{A1}$ and a seal ring $R_{S1}$ surrounding the active area $A_{A1}$. The semiconductor die 11-2 includes an active area $A_{A2}$ and a seal ring $R_{S2}$ surrounding the active area $A_{A2}$. The semiconductor die 11-3 includes an active area $A_{A3}$ and a seal ring $R_{S3}$ surrounding the active area $A_{A3}$. The semiconductor die 11-4 includes an active area $A_{A4}$ and a seal ring $R_{S4}$ surrounding the active area $A_{A4}$. A seal frame $F_S$ on the base layer 10 surrounds the semiconductor dies 11-1, 11-2, 11-3 and 11-4 to define the die region 12.

Also, the semiconductor dies 11-1, 11-2, 11-3 and 11-4 can be arranged on as a 2×2 matrix, and are separated from each other by spaces. For example, the semiconductor die 11-1 is spaced apart from the semiconductor die 11-3 by the first space SP1, and is spaced apart from the semiconductor die 11-2 by the second space SP2. Similarly, the semiconductor die 11-4 is spaced apart from the semiconductor die 11-2 by the first space SP1, and is spaced apart from the semiconductor die 11-3 by the second space SP2. Also, the semiconductor dies are electrically connected to each other by the inter-die connection layers $L_{IC}$. For example, the semiconductor die 11-1 is electrically connected to the semiconductor die 11-2 by the inter-die connection layers $L_{IC1}$, and the semiconductor die 11-2 is electrically connected to the semiconductor die 11-4 by the inter-die connection layers $L_{IC2}$. Similarly, the semiconductor die 11-1 is electrically connected to the semiconductor die 11-3 by the inter-die connection layers $L_{IC3}$, and the semiconductor die 11-3 is electrically connected to the semiconductor die 11-4 by the inter-die connection layers $L_{IC4}$.

FIG. 4 is a cross-sectional view taken along the sectional line 4-4 of the semiconductor structure in FIG. 3, wherein the sectional line 4-4 passes through the position between the inter-die connection layers $L_{IC1}$. Therefore, FIG. 4 depicts the configuration of the seal rings of two adjacent semiconductor dies 11-1 and 11-2 without any inter-die connection layer $L_{IC1}$, in accordance with some embodiments of the present disclosure.

As shown in FIG. 4, in some embodiments, the semiconductor die 11-1 includes a seal ring area $A_{R1}$ and an active area $A_{A1}$, and the semiconductor die 11-2 includes a seal ring area $A_{R2}$ and an active area $A_{A2}$. The active areas $A_{A1}$ and $A_{A2}$ may include active elements such as transistors and integrated circuits. Each of the seal ring areas $A_{R1}$ and $A_{R2}$ may include several interconnection stacks laminated vertically to provide mechanical protection and moisture barrier for the active areas $A_{A1}$ and $A_{A2}$.

In this example, three interconnection stacks over the base layer 10 (e.g. on the top surface 101 of the base layer 10) form a seal ring of a semiconductor die. As shown in FIG. 4, the seal ring $R_{S1}$ of the semiconductor die 11-1 includes a first interconnection stack 211 over the base layer 10 and surrounding the active area $A_{A1}$, a second interconnection stack 212 on the first interconnection stack 211 and surrounding the active area $A_{A1}$, and a third interconnection stack 213 on the second interconnection stack 212 and surrounding the active area $A_{A1}$. The first interconnection stack 211 includes several first conductive lines 211L and first conductive vias 211V connecting the first conductive lines 211L. The second interconnection stack 212 includes several second conductive lines 212L and second conductive vias 212V, wherein the second conductive vias 212V connect two adjacent second conductive lines 212L and connect the lowermost second conductive line 212L and the uppermost first conductive line 211L. The third interconnection stack 213 includes at least one third conductive line 213L and several third conductive vias 213V, wherein the third conductive vias 213V connect the third conductive line 213L and the uppermost second conductive line 212L.

In some embodiments, the first conductive lines 211L of the first interconnection stack 211, the second conductive lines 212L of the second interconnection stack 212 and the third conductive line 213L of the third interconnection stack 213 are formed by the first metal layers (e.g. M1), the second metal layers (e.g. M2) and the third metal layers (e.g. M3), respectively. For example, the first conductive lines 211L and the second conductive lines 212L are made of copper (Cu), and the third conductive lines 213L are made of aluminum (Al). In addition, each of the first conductive lines 211L has a first thickness t1, each of the second conductive lines 212L has a second thickness t2, and each of the third conductive lines 213L has a third thickness t3, In some embodiments, wherein the second thickness t2 is greater than the first thickness t1, and the third thickness t3 is greater than the second thickness t2, but it is not limited.

Also, in this example, as shown in FIG. 4, the active area $A_{A1}$ of the semiconductor die 11-1 includes a first conductive stack 311 over the base layer 10, a second conductive stack 312 on the first conductive stack 311 and a third conductive stack 313 on the second conductive stack 312 for forming integrated circuits of the semiconductor die 11-1. In some embodiments, the first conductive stack 311 includes several conductive lines 311L and several conductive vias 311V, the second conductive stack 312 includes two conductive lines 312L and several conductive vias 312V, and the third conductive stack 313 includes one conductive line 313L and several conductive vias 313V. The third conductive stack 313 is electrically connected to the second conductive stack 312, and the second conductive stack 312 is electrically connected to the first conductive stack 311. The first conductive stack 311 may electrically connect one or more active elements (such as transistors) in the base layer 10. In some embodiments, the conductive lines 311L of the first conductive stack 311, the conductive lines 312L of the second conductive stack 312 and the conductive line 313L of the third conductive stack 313 are formed by the first metal layers (e.g. MD, the second metal layers (e.g. M2) and the third metal layers (e.g. M3), respectively.

Similarly, in some embodiments, as shown in FIG. 4, the seal ring $R_{S2}$ of the semiconductor die 11-2 includes a first interconnection stack 221 over the base layer 10 and surrounding the active area $A_{A2}$, a second interconnection stack 222 on the first interconnection stack 221 and surrounding the active area $A_{A2}$, and a third interconnection stack 223 on the second interconnection stack 222 and surrounding the active area $A_{A2}$. The first interconnection stack 221 includes several first conductive lines 221L and first conductive vias 221V connecting the first conductive lines 221L. The second interconnection stack 222 includes several second conductive lines 222L and second conductive vias 222V, wherein the second conductive vias 222V connect two adjacent second conductive lines 222L and connect the lowermost second conductive line 222L and the uppermost first conductive line 221L. The third interconnection stack 223 includes at least one third conductive line 223L and several third conductive vias 223V, wherein the third conductive vias 223V connect the third conductive line 223L and the uppermost second conductive line 222L. In some embodiments, the first conductive lines 221L of the first interconnection stack 221, the second conductive lines 222L of the second interconnection stack 222 and the third conductive line 223L of the third interconnection stack 223 are formed by the first metal layers (e.g. M1), the second metal layers (e.g. M2) and the third metal layers (e.g. M3), respectively.

Also, in this example, as shown in FIG. 4, the active area $A_{A2}$ of the semiconductor die 11-2 includes a first conductive stack 321 over the base layer 10, a second conductive stack 322 on the first conductive stack 321 and a third conductive stack 323 on the second conductive stack 322 for forming integrated circuits of the semiconductor die 11-2. In some embodiments, the first conductive stack 321 includes several conductive lines 321L and several conductive vias 321V, the second conductive stack 322 includes two conductive lines 322L and several conductive vias 322V, and the third conductive stack 323 includes one conductive line 323L and several conductive vias 323V. The third conductive stack 323 is electrically connected to the second conductive stack 322, and the second conductive stack 322 is electrically connected to the first conductive stack 321. The first conductive stack 321 may electrically connect one or more active elements (such as transistors, not shown) in the base layer 10. In some embodiments, the conductive lines 321L of the first conductive stack 321, the conductive lines 322L of the second conductive stack 322 and the conductive line 323L of the third conductive stack 323 are formed by the first metal layers (e.g. M1), the second metal layers (e.g. M2) and the third metal layers (e.g. M3), respectively.

In some embodiments, as shown in FIG. 4, the semiconductor die 11-1 further includes a dummy area $A_{D1}$ between the seal ring area $A_{R1}$ and the active area $A_{A1}$. The dummy area $A_{D1}$ may include several conductive lines similar to the lamination of the conductive lines (e.g. 311L-313L) of the conductive stacks (e.g. 311-313) in the active area $A_{A1}$. Also, the semiconductor die 11-2 further includes a dummy area $A_{D2}$ between the seal ring area $A_{R2}$ and the active area $A_{A2}$. The dummy area $A_{D2}$ may include several conductive lines similar to the lamination of the conductive lines (e.g. 321L-323L) of the conductive stacks (e.g. 321-323) in the active area $A_{A2}$. The dummy areas $A_{D1}$ and $A_{D2}$ act as buffer zone, and the conductive lines in the dummy areas $A_{D1}$ and $A_{D2}$ will enhance the mechanical strength of the conductive lines (e.g. 311L-313L) of the conductive stacks (e.g. 311-313) after the wafer sawing process is performed along the scribe lines between the die regions.

FIG. 5 is a cross-sectional view taken along sectional line 5-5 of the semiconductor structure in FIG. 3, wherein the sectional line 5-5 passes through the position corresponding to the inter-die connection layers $L_{IC1}$. Therefore, FIG. 5 depicts several inter-die connection layers $L_{IC1}$ passes through the seal ring area $A_{R1}$ of the semiconductor die 11-1 and the seal ring area $A_{R2}$ of the semiconductor die 11-2, in accordance with some embodiments of the present disclosure. FIG. 6 depicts a top view of the semiconductor dies 11-1 and 11-2, wherein the inter-die connection layers $L_{IC1}$ pass through the recesses 21R of the seal ring $R_{S1}$ and the recesses 22R of the seal ring $R_{S2}$. As shown in FIG. 6, the recesses 21R of the seal ring $R_{S1}$ are arranged in the second direction D2 (e.g. the Y-direction) and are separated from each other. The recesses 22R of the seal ring $R_{S2}$ opposite to the recesses 21R of the seal ring $R_{S1}$ are arranged in the second direction D2 (e.g. the Y-direction) and are separated from each other. It should be noted that similar or the same reference numbers are used to designate the similar or the identical features/components in FIG. 5, FIG. 6 and FIG. 4, and the details of the similar or the identical features/components (such as the structures and materials thereof) are not repeated herein.

As shown in FIG. 5 and FIG. 6, the adjacent portions of the seal rings $R_{S1}$ and $R_{S2}$ of the two adjacent semiconductor dies 11-1 and 11-2 have recesses 21R and 22R, and the inter-die connection layers $L_{IC1}$ pass through the recesses 21R and 22R. Each of the recesses 21R and 22R may correspond to one or two of the interconnection stacks of the seal rings. In some embodiments, the second interconnection stack 212 of the seal ring $R_{S1}$ has a first recess 211R and the third interconnection stack 213 of the seal ring $R_{S1}$ has a second recess 212R. The second recess 212R is in communication with the first recess 211R. The first recess 211R and the second recess 212R form a recess 21R of the seal ring $R_{S1}$. Similarly, the second interconnection stack 222 of the seal ring $R_{S2}$ has a first recess 221R and the third interconnection stack 223 of the seal ring $R_{S2}$ has a second recess 222R. The second recess 222R is in communication with the first recess 221R. The first recess 221R and the second recess 222R form a recess 22R of the seal ring $R_{S2}$.

In this example, three inter-die connection layers 421, 422 and 423 (referred to as the inter-die connection layers $L_{IC1}$) are constructed for electrically connecting two adjacent semiconductor dies. As shown in FIG. 5, the inter-die connection layers 421 and 422 pass through the first recess 211R of the seal ring $R_{S1}$ and the first recess 221R of the seal ring $R_{S2}$. In some embodiments, the inter-die connection layers 421 and 422, the second conductive lines 212L of the second interconnection stack 212 and the second conductive lines 222L of the second interconnection stack 222 are made of the same material (such as the material of the second metal layer (e.g. M2)). Also, the inter-die connection layers 421 and 422 are level with the second conductive lines 212L and 222L, as shown in FIG. 4 and FIG. 5. The inter-die connection layers 421 and 422 may connect the active elements of the semiconductor dies 11-1 and 11-2.

In addition, as shown in FIG. 5, the inter-die connection layer 423 passes through the second recess 212R of the seal ring $R_{S1}$ and the second recess 222R of the seal ring $R_{S2}$. In some embodiments, the inter-die connection layer 423, the third conductive lines 213L of the third interconnection stack 213 and the third conductive lines 223L of the third interconnection stack 223 are made of the same material (such as the material of the third metal layer (e.g. M3)). Also, the inter-die connection layer 423 is level with the third conductive lines 213L and 223L, as shown in FIG. 4 and FIG. 5. The inter-die connection layer 423 may connect other active elements of the semiconductor dies 11-1 and 11-2.

The first conductive lines (e.g. 211L and 221L) and the third conductive lines (e.g. 213L and 223L) may be made of different materials. The second conductive lines (e.g. 212L and 222L) and the third conductive lines (e.g. 213L and 223L) may be made of different materials. For example, the first conductive lines (e.g. 211L and 221L) and the second conductive lines (e.g. 212L and 222L) are made of copper (Cu), and the third conductive lines (e.g. 213L and 223L) are made of aluminum (Al). In addition, in some embodiments, each of the first conductive lines 211L and 221L has a first thickness t1, each of the second conductive lines 212L and 222L has a second thickness t2, and each of the third conductive lines 213L and 223L has a third thickness t3, wherein the second thickness t2 is greater than the first thickness t1, and the third thickness t3 is greater than the second thickness t2. In some embodiments, each of the inter-die connection layers 421, 422 and 433 has a thickness (e.g. t2) that is greater than the thickness (e.g. t1) of each one of the first conductive lines 211L and 221L. Also, in some embodiments, the inter-die connection layer 423 (such as the one that is formed by the third metal layer (M3)) has a third thickness t3, which is greater than the thickness (e.g. t1) of either of the first conductive lines 211L and 221L. Also, in some embodiments, the third thickness t3 of the inter-die connection layer 423 is greater than the second thickness t2 of each of the inter-die connection layers 421 and 422.

Also, in some embodiments, as shown in FIG. 4 and FIG. 5, each of the semiconductor dies further includes a dummy area surrounding the active area and positioned between the seal ring area and the active area. For example, the dummy area $A_{D1}$ is formed between the seal ring area $A_{R1}$ and the active area $A_{A1}$ of the semiconductor die 11-1, and the dummy area $A_{D2}$ is formed between the seal ring area $A_{R2}$ and the active area $A_{A2}$ of the semiconductor die 11-2, as described above. In some embodiments, as shown in FIG. 5 and FIG. 6, the inter-die connection layers $L_{IC1}$ further pass through the recesses 31R in the dummy area $A_{D1}$ and the recesses 32R in the dummy area $A_{D2}$. As shown in FIG. 6, the recesses 31R in the dummy area $A_{D1}$ are arranged in the second direction D2 (e.g. the Y-direction) and are separated from each other. The recesses 32R in the dummy area $A_{D2}$ opposite to the recesses 31R in the dummy area $A_{D1}$ are arranged in the second direction D2 (e.g. the Y-direction) and are separated from each other.

It should be noted that the number of inter-die connection layers $L_{IC1}$ can be varied and determined according to design requirements of the to-be-formed semiconductor structure in the application. Some of the variations of the embodiments are provided below for the illustration.

Figure 7A:
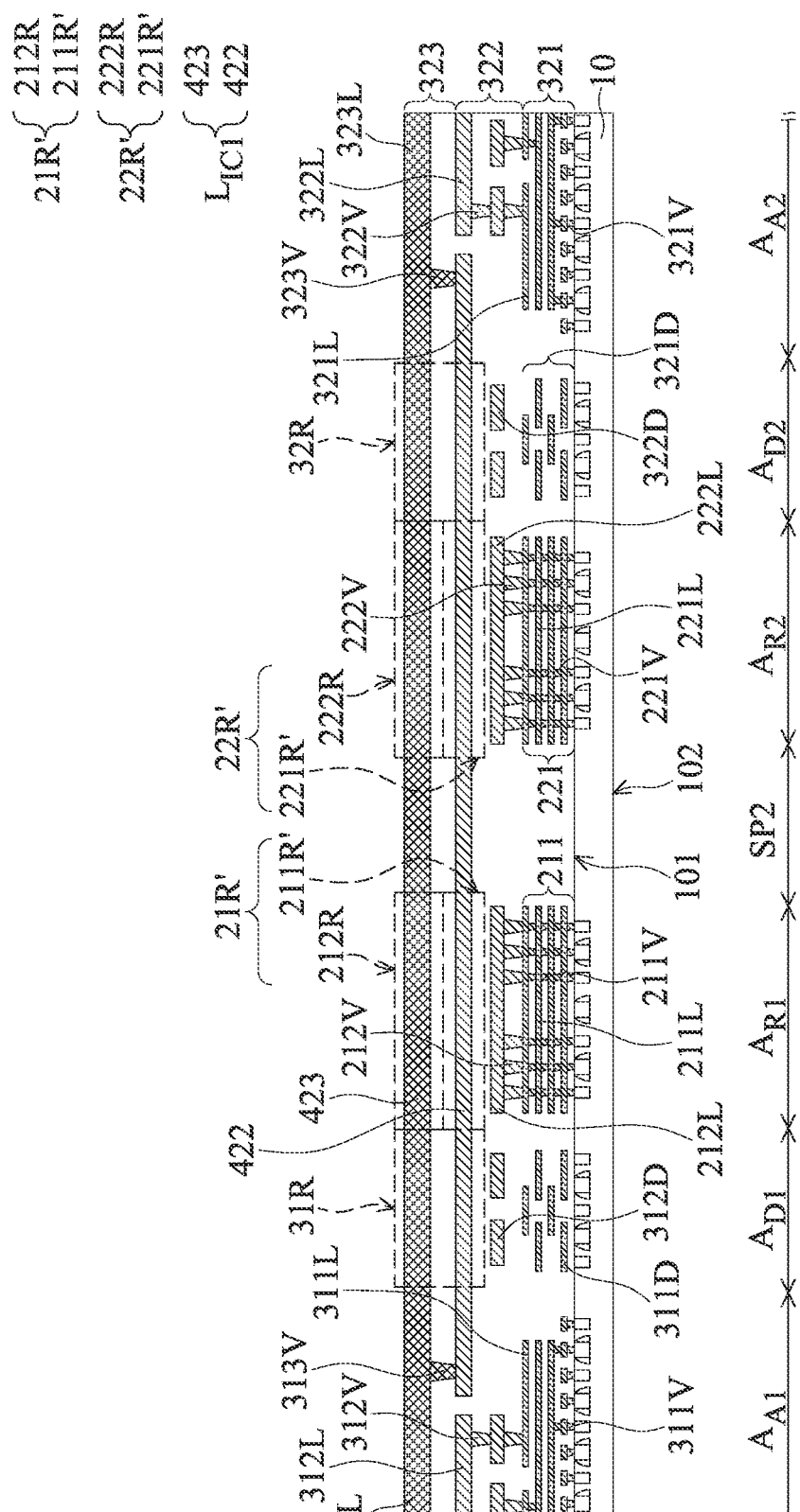
FIG. 7A is a cross-sectional view of a semiconductor structure, in accordance with some embodiments of the present disclosure.

FIG. 7A is a cross-sectional view of a semiconductor structure, in accordance with some embodiments of the disclosure. Referring to FIG. 4 and FIG. 7A, two inter-die connection layers are formed as conductive bridges between adjacent semiconductor dies. It should be noted that similar or the same reference numbers are used to designate the similar or the identical features/components in FIG. 7A and FIGS. 4-5, and the details of the similar or the identical features/components (such as the structures and materials thereof) are not repeated herein.

The difference between the semiconductor structure of FIG. 7A and the semiconductor structure of FIG. 5 is the number of inter-die connection layers $L_{IC1}$ for electrically connecting the semiconductor dies 11-1 and 11-2.

In FIG. 7A, two inter-die connection layers $L_{IC1}$ (including one inter-die connection layer 423 and one inter-die connection layer 422) are constructed for electrically connecting two adjacent semiconductor dies. As shown in FIG. 7A, in some embodiments, the inter-die connection layer 422 passes through the first recess 211R' of the seal ring $R_{S1}$ and the first recess 221R' of the seal ring $R_{S2}$. Also, in this example, the inter-die connection layer 422 further passes through the recesses 31R in the dummy area $A_{D1}$ and the recesses 32R in the dummy area $A_{D2}$, as shown in FIG. 7A. In some embodiments, the inter-die connection layer 422, the second conductive lines 212L of the second interconnection stack 212 and the second conductive lines 222L of the second interconnection stack 222 are made of the same material (such as the material of the second metal layer (e.g. M2)). Also, the inter-die connection layer 422 is level with one of the second conductive lines 212L or 222L. For example, the inter-die connection layer 422 is level with the uppermost layer of the second conductive lines 212L and 222L, as shown in FIG. 7A.

In addition, as shown in FIG. 7A, the inter-die connection layer 423 passes through the second recess 212R of the seal ring $R_{S1}$ and the second recess 222R of the seal ring $R_{S2}$. Also, in this example, the inter-die connection layer 423 further passes through the recesses 31R in the dummy area $A_{D1}$ and the recesses 32R in the dummy area $A_{D2}$, as shown in FIG. 7A. In some embodiments, the inter-die connection layer 423, the third conductive lines 213L of the third interconnection stack 213 and the third conductive lines 223L of the third interconnection stack 223 are made of the same material (such as the material of the third metal layer (e.g. M3)). Also, the inter-die connection layer 423 is level with the third conductive lines 213L and 223L, as shown in FIG. 4 and FIG. 7A. The inter-die connection layer 422 may connect the active elements of the semiconductor dies 11-1 and 11-2, while the inter-die connection layer 423 may connect other active elements of the semiconductor dies 11-1 and 11-2.

In addition, the recess 21R of the seal ring $R_{S1}$ and the recess 22R of the seal ring $R_{S2}$ in FIG. 5 are deeper than the recess 21R' of the seal ring $R_{S1}$ and the recess 22R' of the seal ring $R_{S2}$ in FIG. 7A. For example, the first recesses 211R and 221R (through which two inter-die connection layers 421 and 422 pass) in FIG. 5 are deeper than the first recesses 211R' and 221R' (through which one inter-die connection layer 422 passes) in FIG. 7A.

Figure 7B:
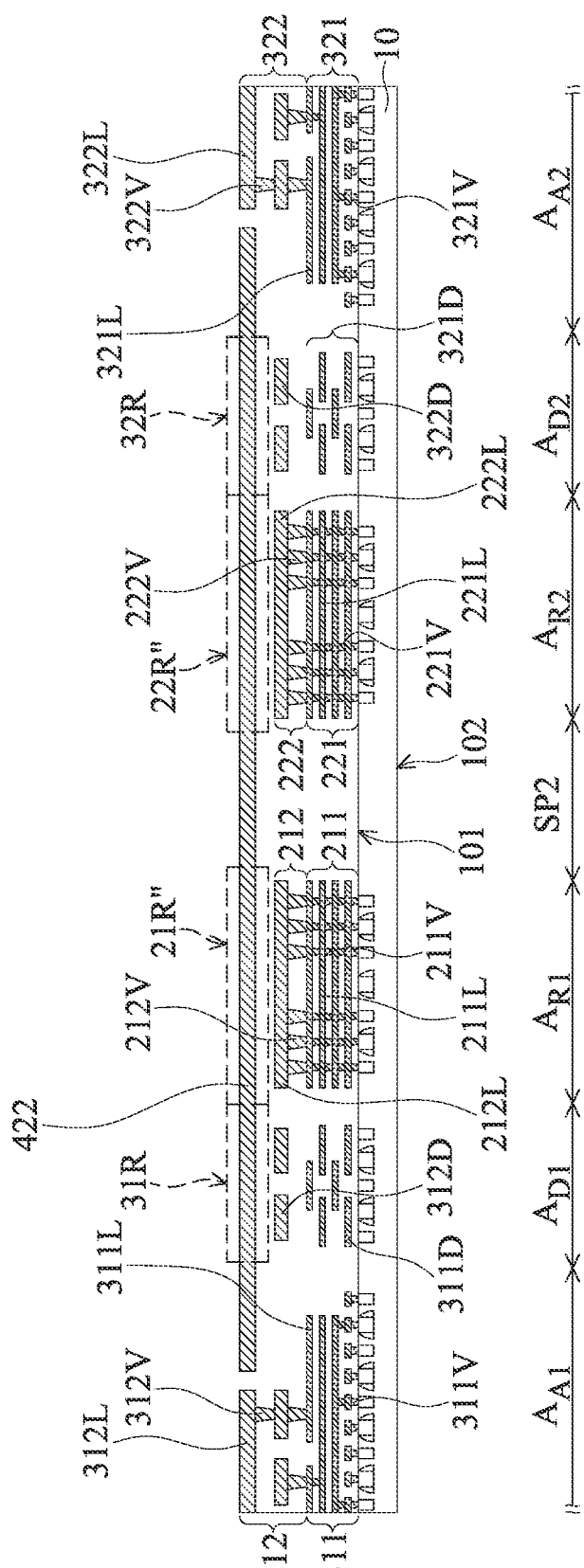
FIG. 7B is a cross-sectional view of a semiconductor structure, in accordance with some embodiments of the present disclosure.

FIG. 7B is a cross-sectional view of a semiconductor structure, in accordance with some embodiments of the disclosure. Referring to FIG. 4 and FIG. 7B, one inter-die connection layer is formed as conductive bridges between adjacent semiconductor dies, and the seal ring is formed by two interconnection stacks. It should be noted that similar or the same reference numbers are used to designate the similar or the identical features/components in FIG. 7B and FIGS. 4-5, and the details of the similar or the identical features/components (such as the structures and materials thereof) are not repeated herein.

The differences between the semiconductor structure of FIG. 7B and the semiconductor structure of FIG. 5 include the number of interconnection stacks of the seal ring and the number of inter-die connection layers $L_{IC1}$ used for electrically connecting the semiconductor dies 11-1 and 11-2.

In FIG. 7B, two interconnection stacks over the base layer 10 form a seal ring of a semiconductor die. For example, the seal ring $R_{S1}$ of the semiconductor die 11-1 includes a first interconnection stack 211 over the base layer 10 and a second interconnection stack 212 on the first interconnection stack 211, wherein the first interconnection stack 211 and the second interconnection stack 212 surround the active area $A_{A1}$. The first interconnection stack 211 includes several first conductive lines 211L and first conductive vias 211V connecting the first conductive lines 211L. The second interconnection stack 212 includes several second conductive lines 212L and second conductive vias 212V, wherein the second conductive vias 212V connect two adjacent second conductive lines 212L and connect the lowermost second conductive line 212L and the uppermost first conductive line 211L. In some embodiments, the first conductive lines 211L of the first interconnection stack 211 are formed by the first metal layers (e.g. M1), and the second conductive lines 212L of the second interconnection stack 212 are formed by the second metal layers (e.g. M2).

Also, as shown in FIG. 7B, the active area $A_{A1}$ of the semiconductor die 11-1 includes a first conductive stack 311 over the base layer 10 and a second conductive stack 312 on the first conductive stack 311 for forming integrated circuits of the semiconductor die 11-1. In some embodiments, the first conductive stack 311 includes several conductive lines 311L and several conductive vias 311V. The second conductive stack 312 includes two conductive lines 312L and several conductive vias 312V. The second conductive stack 312 is electrically connected to the first conductive stack 311. The first conductive stack 311 may electrically connect one or more active elements (such as transistors) in the base layer 10. In some embodiments, the conductive lines 311L of the first conductive stack 311 are formed by the first metal layers (e.g. M1), and the conductive lines 312L of the second conductive stack 312 are formed by the second metal layers (e.g. M2).

Similarly, in some embodiments, as shown in FIG. 7B, the seal ring $R_{S2}$ of the semiconductor die 11-2 includes a first interconnection stack 221 over the base layer 10 and a second interconnection stack 222 on the first interconnection stack 221, wherein the first interconnection stack 221 and the second interconnection stack 222 surround the active area $A_{A2}$. The first interconnection stack 221 includes several first conductive lines 221L and first conductive vias 221V connecting the first conductive lines 221L. The second interconnection stack 222 includes several second conductive lines 222L and second conductive vias 222V, wherein the second conductive vias 222V connect two adjacent second conductive lines 222L and connect the lowermost second conductive line 222L and the uppermost first conductive line 221L. In some embodiments, the first conductive lines 221L of the first interconnection stack 221 are formed by the first metal layers (e.g. M1), and the second conductive lines 222L of the second interconnection stack 222 are formed by the second metal layers (e.g. M2).

Also, in this example, as shown in FIG. 7B, the active area $A_{A2}$ of the semiconductor die 11-2 includes a first conductive stack 321 over the base layer 10 and a second conductive stack 322 on the first conductive stack 321 for forming integrated circuits of the semiconductor die 11-2. In some embodiments, the first conductive stack 321 includes several conductive lines 321L and several conductive vias 321V. The second conductive stack 322 includes two conductive lines 322L and several conductive vias 322V. The second conductive stack 322 is electrically connected to the first conductive stack 321. The first conductive stack 321 may electrically connect one or more active elements (such as transistors, not shown) in the base layer 10. In some embodiments, the conductive lines 321L of the first conductive stack 321 are formed by the first metal layers (e.g. M1), and the conductive lines 322L of the second conductive stack 322 are formed by the second metal layers (e.g. M2).

In FIG. 7B, an inter-die connection layer 422 is constructed for electrically connecting two adjacent semiconductor dies. For example, a power element of the semiconductor die 11-1 is electrically connected to a power element of the semiconductor die 11-2 by the inter-die connection layer 422. As shown in FIG. 7B, in some embodiments, the inter-die connection layer 422 passes through the recess 21R" of the seal ring $R_{S1}$ and the recess 22R" of the seal ring $R_{S2}$. Also, in this example, the inter-die connection layer 422 further passes through the recesses 31R in the dummy area $A_{D1}$ and the recesses 32R in the dummy area $A_{D2}$, as shown in FIG. 7B. In some embodiments, the inter-die connection layer 422, the second conductive lines 212L of the second interconnection stack 212 and the second conductive lines 222L of the second interconnection stack 222 are made of the same material (such as the material of the second metal layer (e.g. M2)). Also, the inter-die connection layer 422 is level with one of the second conductive lines 212L or 222L. For example, the inter-die connection layer 422 is level with the uppermost layer of the second conductive lines 212L and 222L, as shown in FIG. 7B.

Although the inter-die connection layers described above are formed in the recesses of the seal rings of the semiconductor dies in some embodiments, the present disclosure is not limited thereto. In some other embodiments, the inter-die connection layers can be formed above the seal rings of two adjacent semiconductor dies in a die region without recessing any part of the seal rings.

Figure 8:
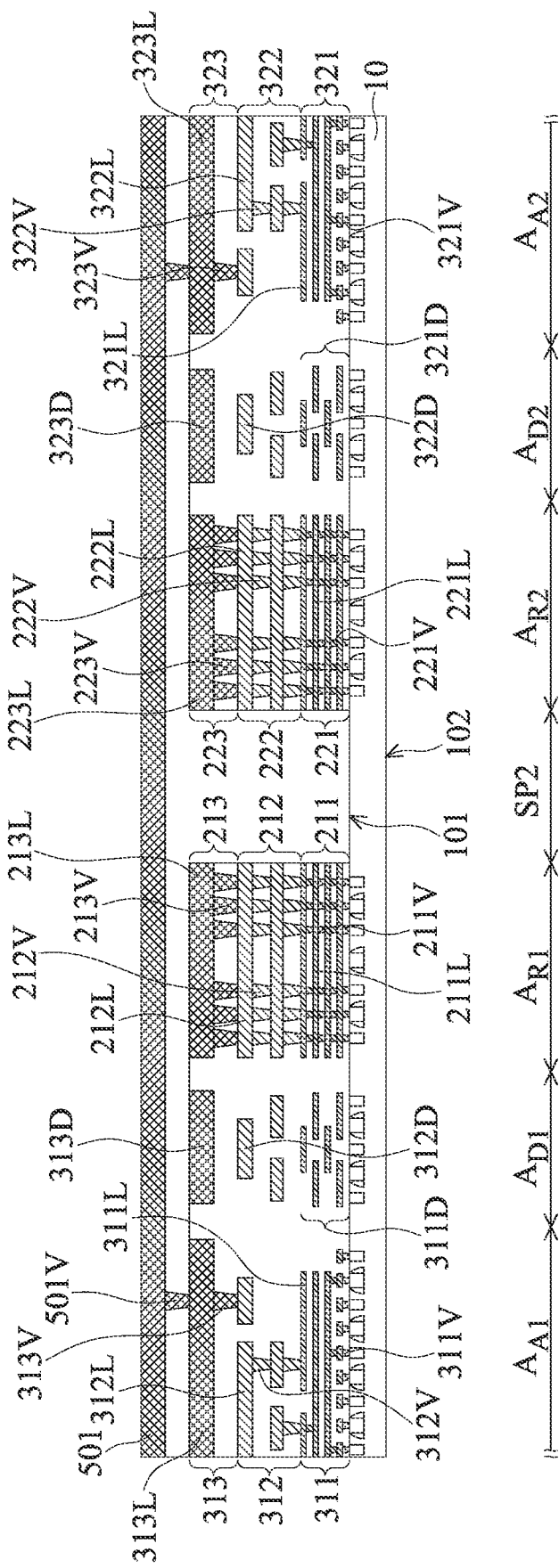
FIG. 8 is a cross-sectional view of a semiconductor structure, in accordance with some other embodiments of the disclosure.

FIG. 8 is a cross-sectional view of a semiconductor structure, in accordance with some other embodiments of the disclosure. It should be noted that similar or the same reference numbers are used to designate the similar or the identical features/components in FIG. 8 and FIGS. 4, 5, 7A and 7B, and the details of the similar or the identical features/components (such as the structures and materials thereof) are not repeated herein.

As shown in FIG. 8, each of the seal rings includes several interconnection stacks over the base layer 10. For example, the seal ring $R_{S1}$ of the semiconductor die 11-1 includes a first interconnection stack 211 over the base layer 10 and surrounding the active area $A_{A1}$, a second interconnection stack 212 on the first interconnection stack 211 and surrounding the active area $A_{A1}$, and a third interconnection stack 213 on the second interconnection stack 212 and surrounding the active area $A_{A1}$. The seal ring $R_{S2}$ of the semiconductor die 11-2 includes a first interconnection stack 221 over the base layer 10 and surrounding the active area $A_{A2}$, a second interconnection stack 222 on the first interconnection stack 221 and surrounding the active area $A_{A2}$, and a third interconnection stack 223 on the second interconnection stack 222 and surrounding the active area $A_{A2}$.

In some embodiments, as shown in FIG. 8, the inter-die connection layer 501 is formed above those interconnection stacks (e.g. 211/212/213, and 221/222/223). Also, the inter-die connection layer 501 extends over adjacent portions of the seal ring $R_{S1}$ in the seal ring area $A_{R1}$ and the seal ring $R_{S2}$ in the seal ring area $A_{R2}$ of the semiconductor dies 11-1 and 11-2. The inter-die connection layer 501 may connect the active elements of the semiconductor dies 11-1 and 11-2 through the vias 501V, thereby acting as a bridge between the semiconductor dies 11-1 and 11-2.

In addition, in some embodiments, as shown in FIG. 8, the inter-die connection layer 501 and the uppermost conductive layer (e.g. the third conductive lines 213L and 223L) of the interconnection stacks (e.g. 211-213 and 221-223) of the seal rings $R_{S1}$ and $R_{S2}$ are made of the same material. However, the present disclosure is not limited thereto. The material of the inter-die connection layer 501 can be identical to or different from the material of the uppermost conductive line (e.g. the third conductive lines 213L and 223L) of the seal rings $R_{S1}$ and $R_{S2}$.

Figure 9A:
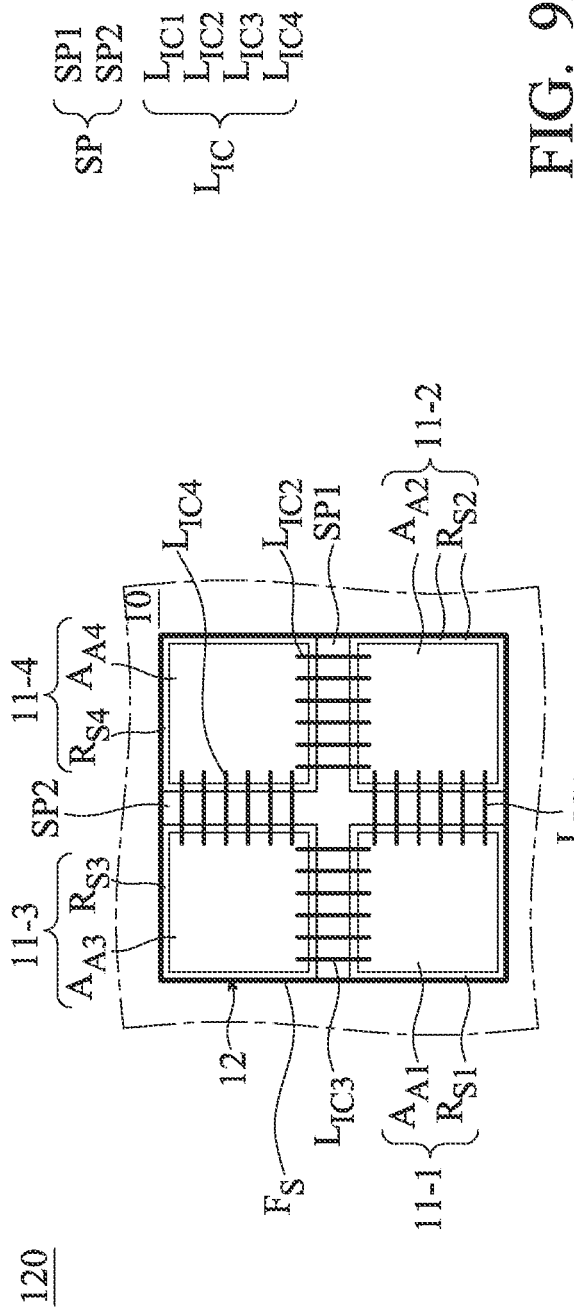
FIG. 9A is a top view of a multi-dies component, in accordance with some embodiments of the present disclosure.

FIG. 9A is a top view of a multi-dies component 120, in accordance with some embodiments of the present disclosure. After the wafer sawing process is performed along the scribe lines between the die regions on the wafer (as shown in FIG. 2), several multi-dies components can be obtained. Each of the multi-dies components may include two or more semiconductor dies. In this example, as shown in FIG. 9A, a multi-dies component 120 including four semiconductor dies 11-1, 11-2, 11-3 and 11-4 is depicted for exemplification. It should be noted that similar or the same reference numbers are used to designate the similar or the identical features/components in FIG. 9A, FIG. 1B and FIG. 3. The details (such as the structures and materials) of the semiconductor dies 11-1, 11-2, 11-3 and 11-4 and the related elements (such as the seal frame $F_S$, the first space SP1, the second space SP2, and the inter-die connection layers $L_{IC1}$-$L_{IC4}$) have been described above and are not repeated.

Figure 9B:
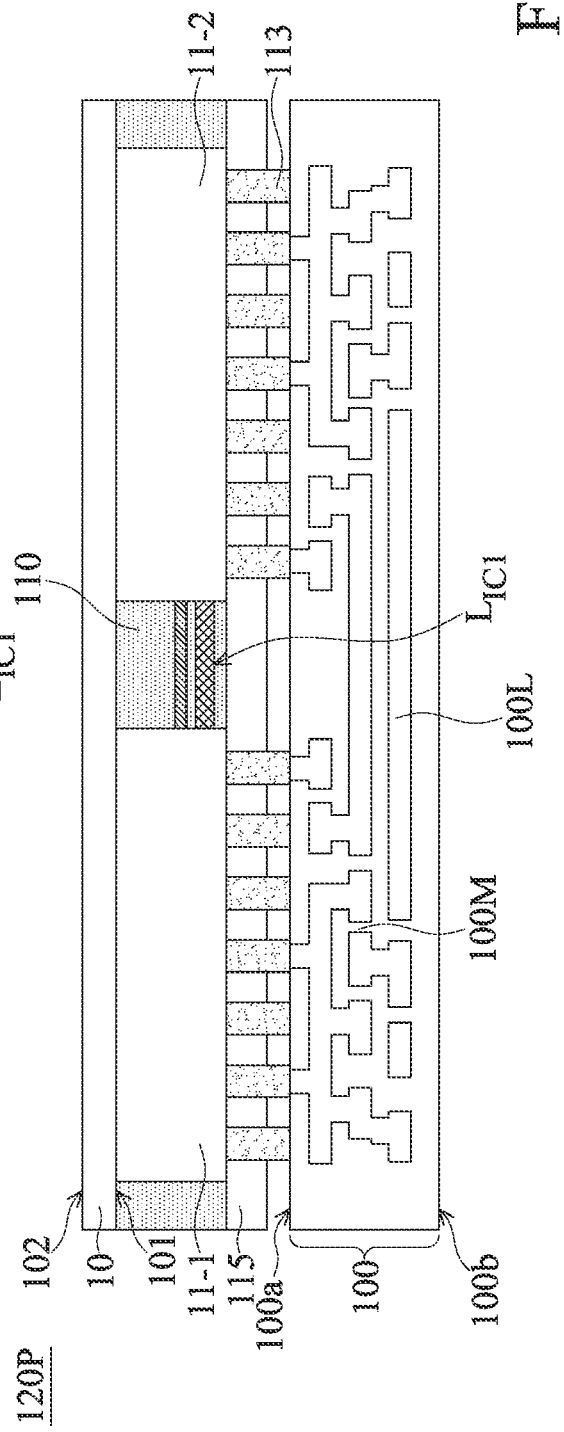
FIG. 9B is a cross-sectional view of a package structure including the multi-dies component in FIG. 9A, in accordance with some embodiments of the present disclosure.

FIG. 9B is a cross-sectional view of a package structure 120P including the multi-dies component 120 in FIG. 9A, in accordance with some embodiments of the present disclosure. FIG. 9B merely depicts the semiconductor dies 11-1 and 11-2 of the multi-dies component 120 in the package structure 120P due to the cross-sectional illustration. Also, it should be noted that two or more multi-die components can be disposed on a substrate of a package structure, depending on design requirements of the application. To simplify the diagram, one multi-dies component 120 is disposed on the substrate 100 of the package structure 120P.

In some embodiments, a package structure 120P includes a substrate 100 and a multi-dies component 120 bonded to the substrate 100. In this example, as shown in FIG. 9B, the substrate 100 has a first surface 100a and a second surface 100b opposite to the first surface 100a. The substrate 100 includes a redistribution pattern 100L having redistribution layers (RDL) and other elements such as conductive vias and conductive pads. Arrangement of the redistribution pattern 100L is determined according to the substrate design of the application. In some embodiments, the multi-dies component 120 is disposed over the first surface 100a of the substrate 100, and the multi-dies component 120 is electrically coupled to the redistribution layers of the redistribution pattern 100L in the substrate 100.

In some embodiments, the substrate 100 also includes inter-metal dielectric (IMD) layers 100M, and the redistribution pattern 100L is embedded in the inter-metal dielectric layers 100M. In some embodiments, the inter-metal dielectric layers may be formed of organic materials, which include a polymer base material, non-organic materials, which include silicon nitride ($SiN_x$), silicon oxide ($SiO_x$), grapheme, or the like. For example, the inter-metal dielectric layers are made of a polymer base material. It should be noted that the number and configuration of the inter-metal dielectric layers, the conductive pads, the conductive vias and the redistribution layers shown in FIG. 9B are only depicted for exemplification and are not limitations to the present invention.

In some embodiments, the multi-dies component 120 includes several semiconductor dies on the base layer 10, such as the semiconductor dies 11-1, 11-2, 11-3 and 11-4 of FIG. 9A. Also, the semiconductor dies 11-1, 11-2, 11-3 and 11-4 are disposed on the top surface 101 of the base layer 10, and are spaced apart from each other. In some embodiments, as shown in FIG. 9B, the package structure 120P also includes a plurality of conductive structures 113, wherein the multi-dies component 120 is bonded to the substrate 100 through the conductive structures 113. In some embodiments, as shown in FIG. 9B, the top surface 101 of the base layer 10 of the multi-dies component 120 faces the first surface 100a of the substrate 100. The conductive structures 113 are disposed over the first surface 100a of the substrate 100 and below the first semiconductor dies 11-1 and 11-2.

In addition, the inter-die connection layers $L_{IC}$ are formed for electrically connecting two adjacent semiconductor dies. For example, as shown in FIG. 9A and FIG. 9B, the inter-die connection layers $L_{IC1}$ electrically connect the semiconductor dies 11-1 and 11-2 as a conductive bridge between the semiconductor dies 11-1 and 11-2. Also, the inter-die connection layers $L_{IC}$ extend over the seal rings (such as the seal rings $R_{S1}$ and $R_{S2}$) of two adjacent semiconductor dies, as mentioned in the above descriptions. Also, the inter-die connection layers $L_{IC}$ pass through the space between the two adjacent semiconductor dies of the multi-dies component 120. For example, as shown in FIG. 9B, the inter-die connection layers $L_{IC1}$ pass through the second space SP2 between the first semiconductor die 11-1 and the second semiconductor die 11-2. In addition, in some embodiments, as shown in FIG. 9B, when the multi-dies component 120 is bonded to the substrate 100, the inter-die connection layers $L_{IC}$ are positioned between the top surface 101 of the base layer 10 and the first surface 100a of the substrate 100. The details such as the structure and the material of the inter-die connection layers $L_{IC}$ have been described above, and are not repeated herein.

In some embodiments, as shown in FIG. 9B, the package structure 120P also includes a molding material 110 surrounding the semiconductor dies 11-1, 11-2, 11-3 and 11-4 of the multi-dies component 120 and filling the spaces. The molding material 110 adjoins the sidewalls of the semiconductor dies 11-1, 11-2, 11-3 and 11-4. That is, the semiconductor dies 11-1, 11-2, 11-3 and 11-4 are separated from each other by the molding material 110. Also, the molding material 110 encapsulates the inter-die connection layers $L_{IC}$ extending between the semiconductor dies, and the inter-die connection layers $L_{IC}$ pass through the molding material 110. For example, as shown in FIG. 9B, the semiconductor dies 11-1 and 11-2 are separated from each other by the molding material 110. Also, the inter-die connection layers $L_{IC1}$ between the semiconductor dies 11-1 and 11-2 pass through the molding material 110.

In some embodiments, the molding material 110 includes a nonconductive material such as an epoxy, a resin, a moldable polymer, or another suitable molding material. In some embodiments, the molding material 110 is applied as a substantial liquid, and then is cured through a chemical reaction. In some other embodiments, the molding material 110 is an ultraviolet (UV) or thermally cured polymer applied as a gel or malleable solid, and then is cured through a UV or thermal curing process. The molding material 110 may be cured with a mold (not shown).

In some embodiments, the surfaces of the semiconductor dies 11-1 and 11-2 facing away from the first surface 100a of the substrate 100 are exposed by the molding material 110, such that a heat dissipating device (not shown) can directly attached to the surfaces of the semiconductor dies 11-1 and 11-2. As a result, the heat-dissipation efficiency of the semiconductor package structure 120P can be improved, particularly for a large semiconductor package structure, such as 50 mm×50 mm, which is preferred for high power applications.

In some embodiments, as shown in FIG. 9B, the package structure 120P also includes a polymer material 115 disposed under the molding material 110, the semiconductor dies 11-1 and 11-2, and between the conductive structures 113. The package structure 120P may further include an underfill layer (not shown) interposed between the first surface 100a of the substrate 100 and the polymer material 115. In some embodiments, the semiconductor dies 11-1 and 11-2 and the molding material 110 are surrounded by the underfill layer. The polymer material 115 and/or the underfill layer are disposed to compensate for differing coefficients of thermal expansion (CTEs) between the substrate 100, the conductive structures 113, and the semiconductor dies 11-1 and 11-2.

The package structure 120P of FIG. 9B may be mounted on a board (not shown). In some embodiments, the package structure 120P may be a system-in-package (SIP) structure. Moreover, the board may include a printed circuit board (PCB) and may be formed of polypropylene (PP). The package structure 120P may be mounted on the board by a bonding process. For example, the package structure 120P also includes bump structures (not shown) on the second surface 100b of the substrate 100. The bump structures may be conductive ball structures (such as ball grid array (BGA)), conductive pillar structures, or conductive paste structures that are mounted on and electrically coupled to the board (e.g. PCB) by the bonding process.

According to some embodiments described above, the semiconductor structure and a package structure having a multi-dies component obtained from the semiconductor structure achieve several advantages. After a wafer sawing process is performed, several multi-dies components can be obtained. In some embodiments, each of the multi-dies components includes several semiconductor dies. The semiconductor dies of the multi-dies component may have the same function. Also, in some embodiments, two adjacent semiconductor dies of the multi-dies component are electrically connected to each other by one or more inter-die connection layers $L_{IC}$ (as shown in FIG. 1B, FIG. 3, FIG. 5, FIG. 6, FIG. 7A, FIG. 7B and FIG. 8). A package structure can be formed by bonding one or more multi-dies components to a substrate, in accordance with some embodiments of the present disclosure. Electrical communication between adjacent semiconductor dies by the inter-die connection layers $L_{IC}$ can be achieved by the shortest path. Therefore, the semiconductor dies of a multi-dies component can provide fast and reliable signal transmission through the inter-die connection layers. The inter-die connection layers $L_{IC1}$ may extend over the seal ring areas of the adjacent semiconductor dies of a multi-dies component. In some embodiment, the seal rings of the adjacent semiconductor dies have recesses, and one or more inter-die connection layers pass through the recesses of the seal rings. In some other embodiment, one or more inter-die connection layers extending over the seal ring areas are formed above the interconnection stacks of the seal rings. In a conventional package structure, the dies are individually bonded on a substrate, and may be electrically connected to each other by the redistribution layers in the substrate. Also, each die obtained from a conventional wafer may include a single semiconductor die. According to some embodiments, each multi-dies component obtained from a wafer may include two or more semiconductor dies, and a package structure uses on-die routing (e.g. the inter-die connection layers $L_{IC}$) to integrate the semiconductor dies of the multi-dies component. Compared with a package structure including several dies from a conventional wafer, which each die is a single semiconductor die, a package structure that includes a multi-dies component having several semiconductor dies of the embodiments has better electrical performance since signal loss and/or power loss between the semiconductor dies in a multi-dies component (which are electrically connected to each other via the inter-die connection layers $L_{IC}$) can be significantly reduced.

It should be noted that the details of the structures of the embodiments are provided for exemplification, and the described details of the embodiments are not intended to limit the present disclosure. It should be noted that not all embodiments of the invention are shown. Modifications and variations can be made without departing from the spirit of the disclosure to meet the requirements of the practical applications. Thus, there may be other embodiments of the present disclosure which are not specifically illustrated. Furthermore, the accompanying drawings are simplified for clear illustrations of the embodiment. Sizes and proportions in the drawings may not be directly proportional to actual products. Thus, the specification and the drawings are to be regard as an illustrative sense rather than a restrictive sense.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a base layer; and
a die region, comprising:

semiconductor dies on the base layer, and each of the semiconductor dies comprising an active area and a seal ring area including a seal ring surrounding the active area; and a first inter-die connection layer and a second inter-die connection layer over the first inter-die connection layer, the first and second inter-die connection layers electrically connecting two adjacent semiconductor dies, wherein the first and second inter-die connection layers extend in parallel and cross over adjacent portions of the seal rings in the seal ring areas of the two adjacent semiconductor dies, wherein a conductive via is in direct contact with the first inter-die connection layer and the second inter-die connection layer.

2. The semiconductor structure as claimed in claim 1, wherein the adjacent portions of the seal rings of the two adjacent semiconductor dies have recesses, and the first and second inter-die connection layers pass through the recesses.

3. The semiconductor structure as claimed in claim 1, wherein one of the first and second inter-die connection layers is level with one conductive layer of the seal rings.

4. The semiconductor structure as claimed in claim 1, wherein the seal ring of each of the semiconductor dies comprises:
a first interconnection stack over the base layer and surrounding the active area, wherein the first interconnection stack comprises first conductive lines; and
a second interconnection stack on the first interconnection stack and surrounding the active area, wherein the second interconnection stack comprises second conductive lines.

5. The semiconductor structure as claimed in claim 4, wherein the second interconnection stack has a first recess, and the first inter-die connection layer passes through the first recess.

6. The semiconductor structure as claimed in claim 5, wherein the first inter-die connection layer is level with one of the second conductive lines.

7. The semiconductor structure as claimed in claim 5, wherein the second conductive lines and the first inter-die connection layer are made of the same material.

8. The semiconductor structure as claimed in claim 4, wherein a thickness of the first inter-die connection layer is greater than a thickness of one of the first conductive lines.

9. The semiconductor structure as claimed in claim 4, wherein the seal ring of each of the semiconductor dies further comprises:
a third interconnection stack on the second interconnection stack and surrounding the active area, wherein the third interconnection stack comprises third conductive lines,
wherein the second interconnection stack has a first recess, the third interconnection stack has a second recess, and the second recess is in communication with the first recess.

10. The semiconductor structure as claimed in claim 9, wherein the first inter-die connection layer passes through the first recess.

11. The semiconductor structure as claimed in claim 9, wherein the first inter-die connection layer passes through the first recess, and the second inter-die connection layer passes through the second recess.

12. The semiconductor structure as claimed in claim 11, wherein the first inter-die connection layer is level with one of the second conductive lines, and the ether second inter-die connection layer is level with one of the third conductive lines.

13. The semiconductor structure as claimed in claim 11, wherein the second conductive lines and the first inter-die connection layer are made of the same material, and the third conductive lines and the second inter-die connection layer are made of the same material.

14. The semiconductor structure as claimed in claim 11, wherein the first inter-die connection layer and the second inter-die connection layer are made of different materials.

15. The semiconductor structure as claimed in claim 11, wherein the thickness of the first inter-die connection layer is greater than a thickness of one of the first conductive lines, and a thickness of the second inter-die connection layer is greater than a thickness of one of the second conductive lines.

16. The semiconductor structure as claimed in claim 11, wherein a thickness of the second inter-die connection layer is greater than a thickness of the first inter-die connection layer.

17. The semiconductor structure as claimed in claim 1, further comprising:
a plurality of seal frames on the base layer, wherein each of the plurality of seal frames surrounds parts of the semiconductor dies and defines the die region.

18. The semiconductor structure as claimed in claim 17, wherein the parts of the semiconductor dies in the die region are separated from each other by spaces.

19. The semiconductor structure as claimed in claim 1, further comprising:
a first seal frame on the base layer and surrounding a first group of semiconductor dies, wherein the first seal frame defines a first die region; and
a second seal frame on the base layer and surrounding a second group of semiconductor dies, wherein the second seal frame defines a second die region,
wherein the second die region is adjacent to the first die region, and a scribe line is positioned between the first die region and the second die region.

20. The semiconductor structure as claimed in claim 19, wherein no inter-die connection layer extends over the first die region and the second die region.

21. The semiconductor structure as claimed in claim 19, wherein the number of semiconductor dies in the first die region is the same as the number of semiconductor dies in the second die region.

22. The semiconductor structure as claimed in claim 19, wherein the number of semiconductor dies in the first die region is different from the number of semiconductor dies in the second die region.

23. The semiconductor structure as claimed in claim 19, further comprising:
a third seal frame on the base layer and surrounding a third group of semiconductor dies, wherein the third seal frame defines a third die region, and the number of semiconductor dies in the third die region is different from the number of semiconductor dies in the second die region.

24. The semiconductor structure as claimed in claim 23, wherein the third die region is adjacent to the first die region or the second die region, and another scribe line is positioned between the third die region and the first die region or the second die region.

25. The semiconductor structure as claimed in claim 17, wherein the semiconductor dies of the die region have the same function.

26. The semiconductor structure as claimed in claim 1, wherein the semiconductor dies on the base layer are separated from each other by a spacing pattern, the spacing pattern comprising:
- first spaces extending in a first direction; and
- second spaces extending in a second direction, wherein the first direction is different from the second direction.

27. The semiconductor structure as claimed in claim 26, further comprising:
- a plurality of scribe lines passing through parts of the first spaces and the second spaces.

28. The semiconductor structure as claimed in claim 1, wherein the seal ring includes a plurality of interconnection stacks over the base layer, and the first inter-die connection layer and the second inter-die connection layer are formed above the plurality of interconnection stacks.

29. The semiconductor structure as claimed in claim 28, wherein an uppermost conductive layer of the plurality of interconnection stacks and the second inter-die connection layer are made of the same material.

30. The semiconductor structure as claimed in claim 1, wherein the first and second inter-die connection layers are electrically insulated from the seal ring.

31. The semiconductor structure as claimed in claim 1, wherein the base layer includes active devices electrically connected to the respective semiconductor dies.

32. A package structure, comprising:
- a substrate having a first surface and a second surface opposite to the first surface, wherein the substrate comprises a redistribution layer (RDL);
- a multi-dies component, disposed over the first surface of the substrate and electrically coupled to the redistribution layer of the substrate, wherein the multi-dies component comprises:
  - a base layer;
  - a plurality of semiconductor dies on the base layer and spaced apart from each other; and
  - a first inter-die connection layer and a second inter-die connection layer over the first inter-die connection layer, the first and second inter-die connection layers electrically connecting two adjacent semiconductor dies, wherein the first and second inter-die connection layers extending parallel and cross over seal rings in seal ring areas of the two adjacent semiconductor dies,
- wherein a conductive via is in direct contact with the first inter-die connection layer and the second inter-die connection layer.

* * * * *